(12) United States Patent
Mauder et al.

(10) Patent No.: US 9,570,566 B2
(45) Date of Patent: Feb. 14, 2017

(54) SEMICONDUCTOR DEVICE INCLUDING A TRENCH AT LEAST PARTIALLY FILLED WITH A CONDUCTIVE MATERIAL IN A SEMICONDUCTOR SUBSTRATE

(71) Applicant: Infineon Technologies Austria AG, Villach (AT)

(72) Inventors: Anton Mauder, Kolbermoor (DE); Reinhard Ploss, Unterhaching (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/879,877

(22) Filed: Oct. 9, 2015

(65) Prior Publication Data

US 2016/0035842 A1    Feb. 4, 2016

Related U.S. Application Data

(63) Continuation of application No. 13/571,455, filed on Aug. 10, 2012, now Pat. No. 9,219,144.

(51) Int. Cl.
*H01L 29/78* (2006.01)
*H01L 29/417* (2006.01)
(Continued)

(52) U.S. Cl.
CPC ..... *H01L 29/41766* (2013.01); *H01L 21/2254* (2013.01); *H01L 21/324* (2013.01); *H01L 21/743* (2013.01); *H01L 23/36* (2013.01); *H01L 29/0657* (2013.01); *H01L 29/1079* (2013.01); *H01L 29/167* (2013.01); *H01L 29/41741* (2013.01); *H01L 29/456* (2013.01); *H01L 29/66333* (2013.01); *H01L 29/66666* (2013.01); *H01L 29/66712* (2013.01); *H01L 29/66734* (2013.01); *H01L 29/7395* (2013.01); *H01L 29/7802* (2013.01); *H01L 29/7813* (2013.01); *H01L 29/7827* (2013.01); *H01L 21/2255* (2013.01); *H01L 21/2257* (2013.01); *H01L 21/3247* (2013.01); *H01L 24/05* (2013.01); *H01L 29/0653* (2013.01); *H01L 29/0878* (2013.01);
(Continued)

(58) Field of Classification Search
CPC ...... H01L 21/255; H01L 29/36; H01L 23/481; H01L 21/768
USPC .............................. 257/607, 622, E21.1, 44, E29.055,257/E29.109
See application file for complete search history.

(56) References Cited

U.S. PATENT DOCUMENTS 6,040,208 A    3/2000  Honeycutt et al.
2009/0146701 A1    6/2009  Noguchi et al.
(Continued)

*Primary Examiner* — Selim Ahmed
(74) *Attorney, Agent, or Firm* — Murphy, Bilak & Homiller, PLLC

(57) ABSTRACT

A semiconductor device includes a semiconductor substrate and a first trench extending into or through the semiconductor substrate from a first side. The first trench is at least partially filled with a conductive material and electrically connected to the semiconductor substrate via a doped semiconductor layer at a sidewall of the first trench. A semiconductor layer adjoins the semiconductor substrate at the first side, and caps the first trench at the first side. A contact is disposed at a second side of the semiconductor substrate opposite to the first side. A method of manufacturing the semiconductor device is also provided.

12 Claims, 6 Drawing Sheets

(51) Int. Cl.
　　　*H01L 23/36*　　　(2006.01)
　　　*H01L 21/74*　　　(2006.01)
　　　*H01L 29/06*　　　(2006.01)
　　　*H01L 29/45*　　　(2006.01)
　　　*H01L 29/66*　　　(2006.01)
　　　*H01L 29/10*　　　(2006.01)
　　　*H01L 29/167*　　(2006.01)
　　　*H01L 29/739*　　(2006.01)
　　　H01L 23/00　　　(2006.01)
　　　H01L 21/225　　(2006.01)
　　　H01L 21/324　　(2006.01)
　　　H01L 29/08　　　(2006.01)

(52) U.S. Cl.
　　　CPC .............. *H01L 2224/05009* (2013.01); *H01L 2224/0557* (2013.01); *H01L 2224/05078* (2013.01); *H01L 2924/00014* (2013.01); *H01L 2924/1305* (2013.01); *H01L 2924/1306* (2013.01); *H01L 2924/13055* (2013.01); *H01L 2924/13091* (2013.01)

(56) References Cited

U.S. PATENT DOCUMENTS

| | | | |
|---|---|---|---|
| 2010/0044792 A1* | 2/2010 | Hebert | H01L 29/0623 257/341 |
| 2011/0068475 A1 | 3/2011 | de Fresart et al. | |
| 2011/0291278 A1* | 12/2011 | de Fresart | H01L 21/76876 257/751 |

* cited by examiner

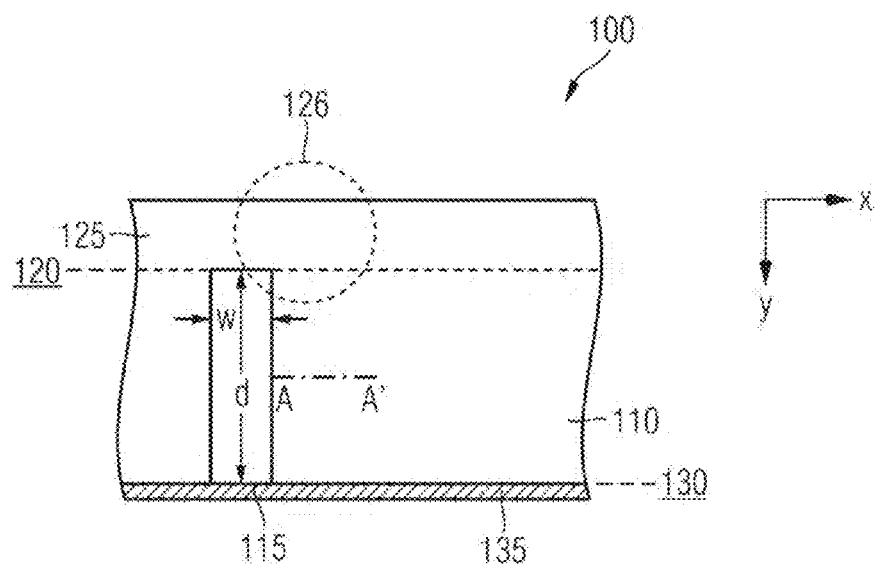
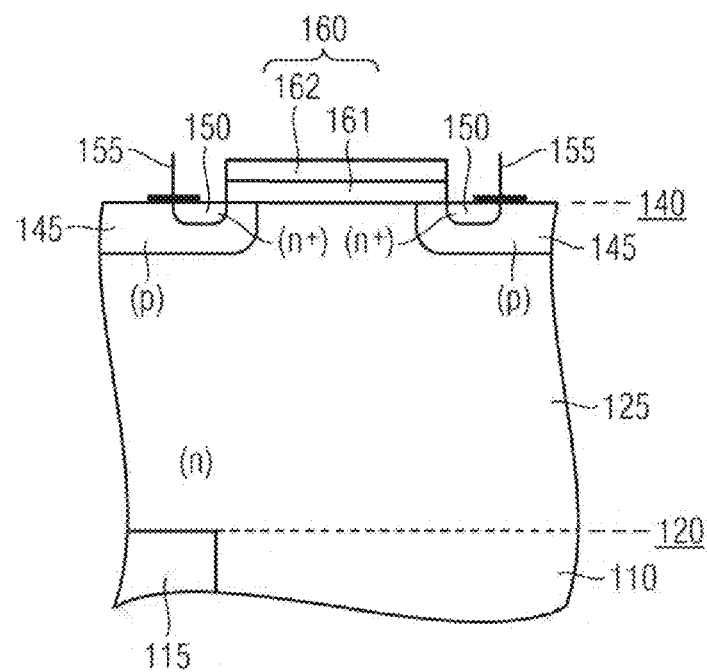

US 9,570,566 B2

1

SEMICONDUCTOR DEVICE INCLUDING A TRENCH AT LEAST PARTIALLY FILLED WITH A CONDUCTIVE MATERIAL IN A SEMICONDUCTOR SUBSTRATE

BACKGROUND

In vertical semiconductor devices, current flows between a first side of a semiconductor die to a second side of the semiconductor die, opposite the first side. As an example, current flows from a source of a field effect transistor (FET) at the first side to a drain at the second side. The semiconductor die may be mounted to a carrier, e.g., a lead frame or a direct copper bonded (DCB) substrate, via the second side. In vertical semiconductor devices, a low ohmic contact between a bottom side of the semiconductor device and the carrier as well as a low ohmic current path through the semiconductor device from the first side to the second side are desirable. In semiconductor devices including high current densities during operation, e.g., in low voltage FETs including voltage blocking capabilities below 100 V, any parasitic resistance between the first side and the second side of the device is detrimental. Since a drift zone of low-voltage semiconductor devices is thin, compared to devices including higher voltage blocking capabilities, thin wafer techniques are one way of realizing the devices.

It is desirable to reduce an on-state resistance in a vertical semiconductor device.

SUMMARY

According to an embodiment, a semiconductor device includes a semiconductor substrate. The semiconductor device further includes a first trench extending into or through the semiconductor substrate from a first side. The semiconductor device further includes a semiconductor layer adjoining the semiconductor substrate at the first side. The semiconductor layer caps the first trench at the first side. The semiconductor device further includes a contact at a second side of the semiconductor substrate opposite to the first side.

According to another embodiment, a semiconductor wafer includes a silicon substrate. The semiconductor wafer further includes a trench extending into the silicon substrate from a first side. The semiconductor wafer further includes a semiconductor layer adjoining the silicon substrate, wherein the semiconductor layer caps the first trench at the first side.

According to another embodiment, a method of manufacturing a semiconductor device includes forming a first trench into a semiconductor substrate from a first side. The method further includes forming a semiconductor layer adjoining the semiconductor substrate at the first side, wherein the semiconductor layer caps the first trench at the first side. The method further includes forming a contact at a second side of the semiconductor substrate opposite to the first side.

Those skilled in the art will recognize additional features and advantages upon reading the following details of the description and upon viewing the accompanying drawings.

BRIEF DESCRIPTION OF THE DRAWINGS

The accompanying drawings are included to provide a further understanding of the invention and are incorporated in and constitute a part of this specification. The drawings illustrate embodiments of the present invention and together with the description serve to explain principles of the invention. Other embodiments of the invention and intended advantages will be readily appreciated as they become better understood by reference to the following detailed description.

FIG. 1 is a schematic cross-sectional view of a portion of a semiconductor device including a trench in a semiconductor substrate capped by a semiconductor layer.

FIG. 2A is a schematic cross-sectional view of a portion of a planar gate transistor cell formed in the semiconductor layer illustrated in FIG. 1.

DETAILED DESCRIPTION

Figure 2B:
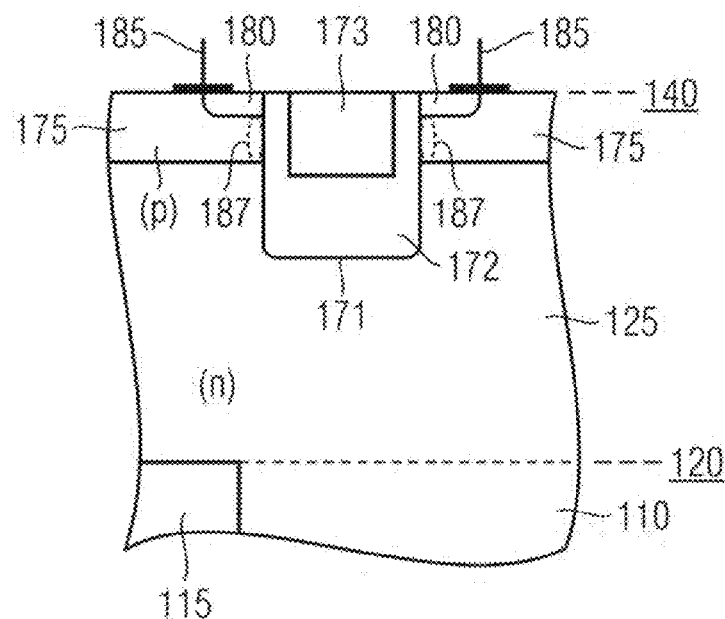
FIG. 2B is a schematic cross-sectional view of a portion of a trench gate transistor cell formed in the semiconductor layer illustrated in FIG. 1.

In the following detailed description, reference is made to the accompanying drawings, which form a part hereof, and in which are shown by way of illustration specific embodiments in which the invention may be practiced. It is to be understood that other embodiments may be utilized and various structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims.

The drawings are not scaled and are for illustrative purposes only. For clarity, corresponding elements have been designated by the same references in the different drawings if not stated otherwise.

Terms such as "first", "second", and the like, are used to describe various elements, regions, sections, etc. and are also not intended to be limiting. Like terms refer to like elements throughout the description.

The terms "having", "containing", "including", "comprising" and the like are open and the terms indicate the presence of stated structures, elements or features but do not preclude additional elements or features.

The articles "a", "an" and "the" are intended to include the plural as well as the singular, unless the context clearly indicates otherwise.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a permanent low-ohmic connection between electrically connected elements, such as a direct contact between the concerned elements or a low-ohmic connection via a metal and/or highly doped semiconductor. The term "electrically coupled" encompasses "electrically connected" but further includes that one or more intervening element(s) adapted for signal transmission may be provided between the electrically coupled elements, such as elements that are controllable to temporarily provide a low-ohmic connection in a first state and a high-ohmic electric decoupling in a second state.

FIG. 1 illustrates a part of a semiconductor device 100 according to an embodiment.

The semiconductor device 100 includes a semiconductor substrate 110. According to an embodiment, the semiconductor substrate 110 is a monocrystalline silicon substrate. According to other embodiments, the semiconductor substrate 110 includes other semiconductor materials, e.g. SiC or GaN.

A first trench 115 extends through the semiconductor substrate 110 from a first side 120. A semiconductor layer 125 adjoins the semiconductor substrate 110 at the first side 120. The semiconductor layer 125 caps the first trench 115 at the first side 120. In other words, the semiconductor layer 125 closes the first trench 115 at the first side 120 and thus acts at a sealing layer sealing the first trench 115 at the first side 120. The first trench 115 is buried in the semiconductor substrate 110 below the semiconductor layer 125.

At a second side 130 of the semiconductor substrate 110, a contact 135 adjoins a bottom side of the first trench 115. The contact 135 includes one or a plurality of conductive materials. As an example, the contact may include a layer or a layer stack of any one or any combination of a highly doped semiconductor, a semiconductor-metal-compound, carbon, a metal and a metal alloy.

In the embodiment illustrated in FIG. 1, the first trench extends through the semiconductor substrate 110 to the contact 135. In other words, the contact 135 closes a bottom side of the first trench 115 and thus act as a sealing layer sealing the first trench 115. According to another embodiment, the first trench 115 may end in the semiconductor substrate 110, and a part of the semiconductor substrate 110 remains between a bottom side of the first trench 115 and the contact 135 at the second side 130.

In the semiconductor layer 125, doped regions constituting functional elements of the semiconductor device 100 are formed. According to an embodiment, the semiconductor device 100 is a discrete semiconductor including a plurality of transistor cells arranged in one or more cell arrays. Examples for the semiconductor device 100 include an FET, e.g. an insulated gate field effect transistor (IGFET), for example a metal oxide semiconductor field effect transistor (MOSFET) including FETs with metal and with non-metal gate electrodes and an insulated bipolar transistor (IGBT). According to another embodiment, the semiconductor device 100 is an integrated circuit including a plurality of circuit elements, e.g., resistors, for example diffusion resistors, transistors, diodes, capacitors.

One example of a planar gate transistor formed in the semiconductor layer 125 is described further below with reference to FIG. 2A. Another example of a trench gate transistor formed in the semiconductor layer 125 is described further below with reference to FIG. 2B. Embodiments of fillings of the first trench 115 are described further below with reference to FIGS. 3A to 3D.

According to an embodiment, a depth d of the first trench 115 along a vertical direction y perpendicular to the first side 120 ranges between 20 μm and 200 μm.

According to an embodiment, a maximum width w of the first trench 115 ranges between 0.2 μm to 10 μm. If the first trench 115 includes a taper, the maximum width refers to that part of the first trench 115 which includes a maximum distance of opposite sidewalls along a lateral direction x.

According to an embodiment, an aspect ratio of the first trench 115 ranges between 10 and 50. The aspect ratio is defined as the depth of a trench divided by its width.

FIG. 2A illustrates a schematic cross-sectional view of a portion of a planar gate transistor cell formed in a part 126 of the semiconductor layer 125 illustrated in FIG. 1. At a surface 140 of the semiconductor layer 125, a p-doped body region 145 and an n+-doped source region 150 are formed. The p-doped body region 145 and the n+-doped source region 150 are electrically coupled to a source contact 155 at the surface 140. An electrical contact between the source contact 155 and the p-doped body region 145 may be improved by arrangement of a p+-doped body contact zone. The source contact 155 is illustrated in a simplified manner in FIG. 2A and may include a conductive material arranged in an opening of a dielectric layer formed on the surface 140. As an example, the contact may be a contact plug or a contact line including highly doped polycrystalline semiconductor material, metal silicide, e.g., any of or any combination of $TiSi_2$, $MoSi_2$, $WSi_2$, $PtSi_2$ and/or metal, e.g., any of or any combination of W, Al, Cu, Pd, Ti, Ta, TiN, TaN, or a combination thereof.

A planar gate structure 160 including a gate dielectric 161 and a gate electrode 162 adjoins the surface 140. A current of the planar gate transistor cell illustrated in FIG. 2A flows between the source contact 155 at the surface 140 along the vertical direction y to the contact 135 at the second side 130

(see also FIG. 1). In the example illustrated in FIGS. 1 and 2A, the contact 135 at the second side is a drain contact.

FIG. 2B illustrates a schematic cross-sectional view of a portion of a trench gate transistor cell formed in the part 126 of the semiconductor layer 125 illustrated in FIG. 1. A gate trench 171 extends into the semiconductor layer 125 from a surface 140. In the embodiments illustrated in FIG. 2B, a bottom side of the gate trench 171 ends above a top side of the first trench 115. In other words, the gate trench 171 ends in the semiconductor layer 125 and does not extend through the semiconductor layer 125 into the semiconductor substrate 110. According to other embodiments, the gate trench 171 extends through the semiconductor layer 125 into the semiconductor substrate 110. The gate trench 171 includes a gate electrode 173 surrounded by a dielectric 172. A part of the dielectric 172 between the gate electrode 173 and a p-doped body region 175 constitutes a gate dielectric. As an example, the gate dielectric may be a thermal oxide. The dielectric 172 may include further dielectric materials and/or layers, e.g., deposited oxides, such oxides deposited by chemical vapor deposition (CVD) and nitrides such as $Si_3N4$.

At a surface 140 of the semiconductor layer 125, the p-doped body region 175 and an $n^+$-doped source region 180 are formed. The p-doped body region 175 and the $n^+$-doped source region 180 are electrically coupled to a source contact 185 at the surface 140. An electrical contact between the source contact 185 and the p-doped body region 175 may be improved by arrangement of a $p^+$-doped body contact zone. The source contact 185 is illustrated in a simplified manner in FIG. 2B and may include a conductive material arranged in an opening of a dielectric layer formed on the surface 140. As an example, the contact may be a contact plug or a contact line including highly doped polycrystalline semiconductor material, metal silicide, e.g., any of or any combination of $TiSi_2$, $MoSi_2$, $WSi_2$, $PtSi_2$ and/or metal, e.g., any of or any combination of W, Al, Cu, Pd, Ti, Ta, TiN, TaN, or a combination thereof.

A current of the trench gate transistor cell illustrated in FIG. 2B flows between the source contact 185 at the surface 140 along the vertical direction y to the contact 135 at the second side 130 (see also FIG. 1). In the example illustrated in FIGS. 1 and 2B, the contact at the second side is a drain contact. A conductivity in a channel region 187 adjoining the gate dielectric can be controlled via a gate voltage applied to the gate electrode 173.

The dielectric 173 surrounding the gate electrode 173 may have different thickness, e.g., may be thicker below the gate electrode 173. Additionally, below the gate electrode 173 one or more additional electrodes may be formed in the gate trench 171 and may be dielectrically insulated from the semiconductor layer 125. This one or more additional electrode(s) may be electrically floating or may be connected to a voltage, e.g., one or more of the additional electrode(s) may be connected to the source potential.

Figure 3A:
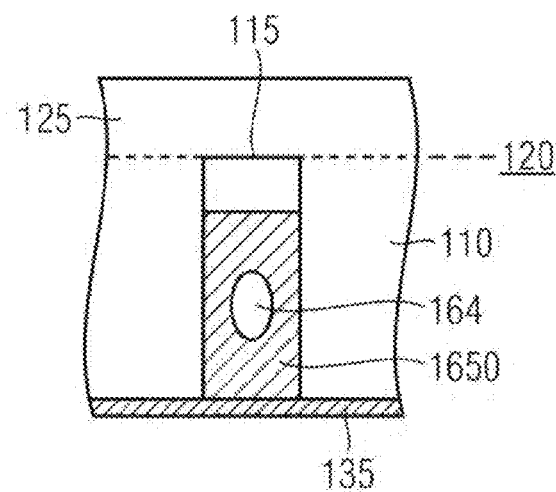
FIG. 3A is a schematic cross-sectional view of the trench illustrated in FIG. 1 partly filled with a conductive material.

FIG. 3A is a schematic cross-sectional view of the first trench 115 illustrated in FIG. 1. In the embodiment illustrated in FIG. 3A, the first trench 115 is partly filled with a conductive material 1650.

According to an embodiment, the conductive material 1650 includes at least one of carbon (C), molybdenum (Mo), titanium (Ti), tantalum (Ta), copper (Cu) and aluminum (Al).

According to an embodiment, a void 164 may be formed in the conductive material 1650 that at least partially fills up the first trench 115. The conductive material 1650 may also be at least partially porous. As an example, porous Cu and/or porous Mo may form part of or constitute the conductive material 165. A porous metal may be formed by the so-called plasmadust technology, for example.

According to several embodiments, a thermal expansion coefficient of the conductive material 1650 and the semiconductor substrate 110 differ by less than 500% or by less than 300%. When selecting the conductive material 1650 in consideration of the thermal expansion coefficient relative to the semiconductor substrate 110, a negative impact on device reliability due to stress induced by a thermal budget can be avoided or reduced. In this regard, a porous structure of the conductive material 1650 or a structure including a void may be beneficial with regard to lowering of stress induced by a thermal budget.

Figure 3B:
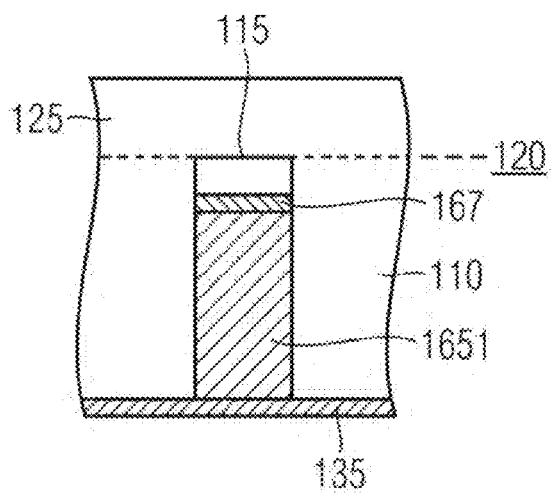
FIG. 3B is a schematic cross-sectional view of the trench illustrated in FIG. 1 partly filled with a conductive material and a diffusion barrier on top of the conductive material.

FIG. 3B is a schematic cross-sectional view of the first trench 115 illustrated in FIG. 1 partly filled with a conductive material 1651 and a diffusion barrier 167 on top of the conductive material 1651. Above-described details of the conductive material 1650 illustrated in FIG. 3A apply to the conductive material 1651. The diffusion barrier 167 may include at least one of TiN, TaN, $Si_3N_4$, $SiO_2$, and any combination thereof. Arrangement of the diffusion barrier 167 is beneficial in case diffusion of the conductive material 1651 out of a top side of the first trench 115 should be avoided or minimized.

Figure 3C:
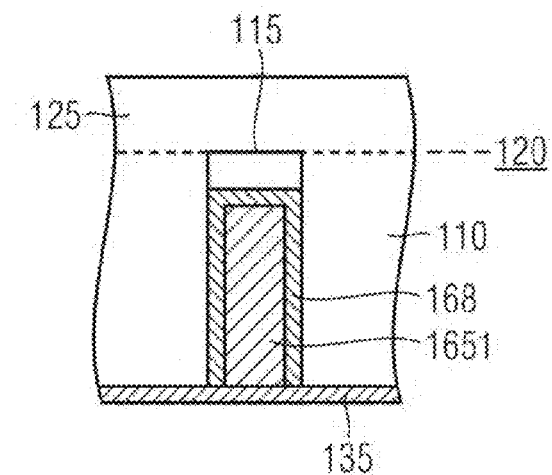
FIG. 3C is a schematic cross-sectional view of the trench illustrated in FIG. 1 partly filled with a conductive material and a diffusion barrier on top and at a side of the conductive material.

FIG. 3C is a schematic cross-sectional view of the first trench 115 illustrated in FIG. 1 partly filled with a conductive material 1651 and a diffusion barrier 168 lining a top side and lateral sides of the conductive material 1651. Details of the conductive material 1650 illustrated in FIG. 3A also apply to the conductive material 1651. The diffusion barrier 168 may include at least one of TiN, TaN, $Si_3N_4$, $SiO_2$, and any combination thereof. As an example, a part of the diffusion barrier 168 lining sides of the conductive material 1651 and a part of the of the diffusion barrier 168 lining the top side of the conductive material 1651 may be of different material. As an example, the part of the diffusion barrier 168 lining lateral sides of the conductive material 1651 may include TiN and the part of the of the diffusion barrier 168 lining the top side of the conductive material 1651 may include $Si_3N_4$. Arrangement of the diffusion barrier 168 is beneficial in case diffusion of the conductive material 1651 out of a top side or lateral sides of the first trench 115 should be avoided or minimized. FIG. 3C is a schematic cross-sectional view after thinning of the semiconductor substrate 110 and after applying the contact layer 135. According to an embodiment, diffusion barrier 168 initially may also be present below the conductive material 1651 and may be removed during the thinning process. However, diffusion barrier 168 may also remain present between contact layer 135 and conductive material 1651.

Figure 3D:
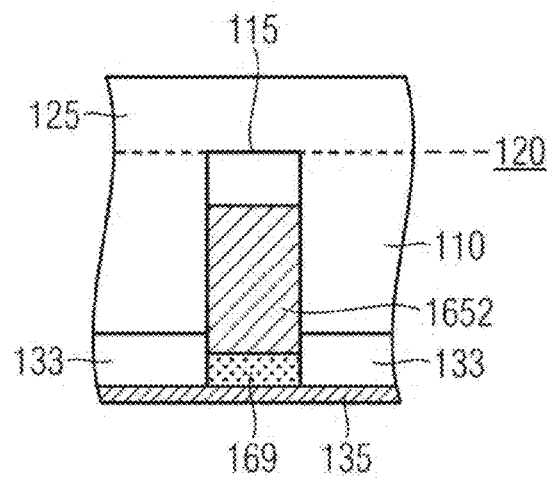
FIG. 3D is a schematic cross-sectional view of the trench illustrated in FIG. 1 partly filled with a conductive material and a dielectric at a bottom of the trench.

FIG. 3D is a schematic cross-sectional view of the first trench 115 illustrated in FIG. 1 partly filled with a conductive material 1652 and a dielectric 169 at a bottom side of the first trench 115. Details of the conductive material 1650 illustrated in FIG. 3A apply to the conductive material 1652. As an example, a material of the dielectric 169 at the bottom side may be chosen in view of its etch selectivity with respect to the material of the semiconductor substrate 110. As an example, the dielectric 169 may include or consist of $SiO_2$ and the semiconductor substrate may include or consist of Si. In this case, a change in a characteristic during removal of the semiconductor substrate occurs when reaching the dielectric 169. This change in a characteristic, e.g., grinding resistance, can be used to terminate removal of the semiconductor substrate. To take full advantage of the conductive material 1652, an optional contact doping 133 of the semiconductor substrate 110 may be implemented, which ensures a low ohmic resistance between the conductive material 1652 and the contact layer 133. Alternatively or additionally, the dielectric 169 may be removed before applying the contact layer 133.

The fillings illustrated in FIGS. 3A and 3D are examples. Other fillings with conductive material or combinations of filling elements illustrated in different examples may apply. As an example, a diffusion barrier may also be arrange at a bottom side of the first trench 115.

Figure 4:
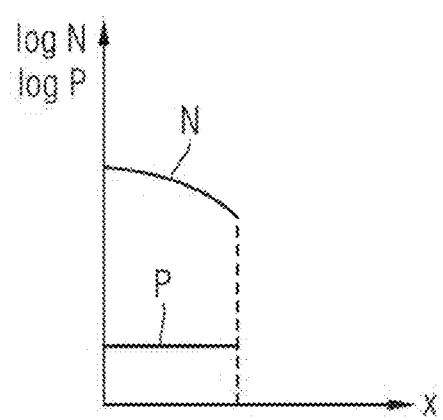
FIG. 4 illustrates is a schematic illustration of one embodiment of a profile of n-doping and p-doping along line A-A' of FIG. 1.

FIG. 4 is a schematic illustration of one embodiment of a profile of n-doping and p-doping along line A-A' of FIG. 1.

The semiconductor substrate 110 includes a background p-doping. As an example, the semiconductor substrate 110 may be formed from a p-doped semiconductor wafer, e.g. a p-doped 12 inch silicon wafer such as a 8 Ωcm/12 inch silicon wafer doped with boron. The p-background doping is constant and denoted by P in FIG. 4. The semiconductor substrate 110 further includes n-type dopants. A profile of concentration of the n-type dopants decreases along the lateral direction x from a sidewall of the first trench 115 into the semiconductor substrate 110. As an example, the n-type dopants may be diffused out of a diffusion source at sidewalls of the first trench 115 into the surrounding semiconductor substrate 110. As a result, the previously p-doped semiconductor wafer becomes n-doped. In an alternative embodiment, the n-doped layer is grown, e.g., epitaxially grown, on a p-doped semiconductor substrate 110. In this case, any form of the n-dopant concentration can be chosen and the p-background doping only may be present, for example, from outdiffusion of the semiconductor substrate 110.

Apart from conductive fillings in the first trench 115 as illustrated in the examples of FIGS. 3A to 3D, doping of the semiconductor substrate 110 via a diffusion source in the first trench 115 further allows improvement of the conductivity of the semiconductor substrate 110, and hence a reduction of parasitic resistance of vertical semiconductor devices formed in the semiconductor substrate 110. In other words, these measures allow the reduction of the on-state resistance in a vertical semiconductor device.

Figure 5:
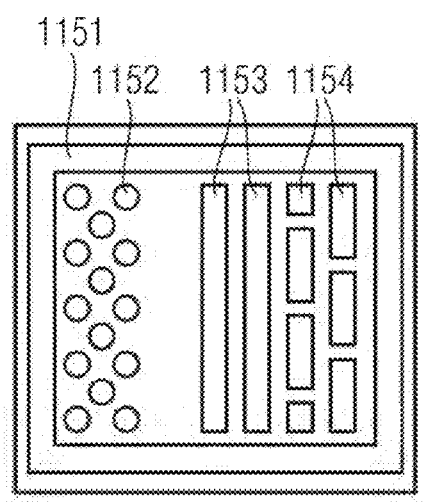
FIG. 5 is a schematic plan view illustrating several trench geometries that may be used individually or in any combination with regard to the first trench illustrated in FIG. 1.

FIG. 5 is a schematic plane view illustrating several trench geometries that may be used individually or in any combination as geometries of the first trench 115 illustrated in FIG. 1. As an example, the first trench 115 may form a closed loop 1151 surrounding an active area of a discrete semiconductor or an integrated circuit. The closed loop may also circumvent a junction termination area of the discrete semiconductor or a device area of the integrated circuit. As a further example, the first trench 115 may be arranged as a pattern of columns 1152 having a circular or elliptical cross-sectional area. As yet another example, the first trench 115 may be arranged as stripes 1153 or a sequence of stripe-shaped segments 1154. A combination of any of these or further geometries may be applied. As an example, the trench forming the closed loop 1151 may have a larger width than the stripes 1153 or segments 1154. In this case, the trench forming the closed loop 1154 may extend deeper into the semiconductor substrate than the stripes 1153 and segments 1154. Separating devices surrounded by the closed loop 1154 may be carried out by removing semiconductor material from a rear side up to a bottom side of the closed loop 1154 and from a front side up to a top side of the closed loop. When diffusing P out of a trench formed as the closed loop 1154, i.e., out of a trench surrounding an active device area, an efficient getter layer may be provided, acting against diffusion of heavy metals from a chip edge into the active device area.

As an example, a lateral distance between neighboring first trenches 115 and the conductive filling may be appropriately chosen to adjust a conductivity of the semiconductor substrate to the needs required for the device(s) to be formed therein.

Figure 6A:
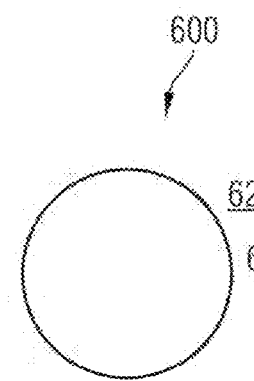
FIGS. 6A and 6B illustrate a schematic cross-sectional view and a schematic plan view of a semiconductor wafer according to an embodiment.
Figure 6B:
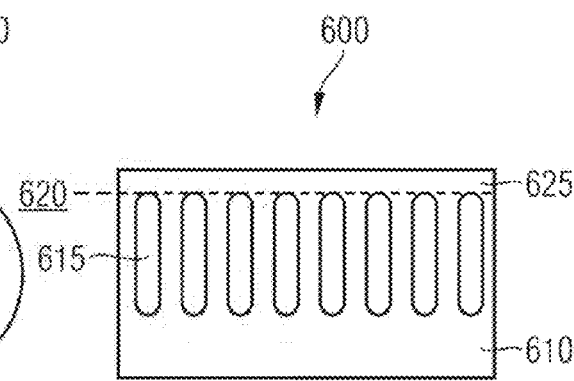

FIGS. 6A and 6B illustrate a schematic cross-sectional view and a schematic plane view of a semiconductor wafer 600 according to an embodiment. The semiconductor wafer may have a diameter of 4 inches (100 mm), 6 inches (150 mm), 8 inches (200 mm), 12 inches (300 mm), or more. The semiconductor wafer 600 illustrated in the schematic plane view of FIG. 6A is a semiconductor wafer 600 including a silicon substrate 610. As is illustrated in the schematic cross-sectional view of FIG. 6B, a first trench 615 extends into the silicon substrate 610 from a first side 620. A silicon layer 625, realized by an epitaxial process or realized by a reflow process of silicon close to a surface by an appropriate annealing process in combination with a subsequent epitaxial deposition of a silicon layer or realized by a wafer bonding process, adjoins the silicon substrate 610 and caps the first trench 615 at the first side 620. A top side and a bottom side of the first trench 615 may include a curved shape that may be due to surface diffusion mediated reflow of material of the semiconductor substrate 610 by a heat treatment of the semiconductor substrate 610 when forming the silicon layer 625 capping a top side of the first trench 615. Examples of geometries of the first trench 615 in plan view are illustrated in FIG. 5. Examples of fillings of the first trench 615 and doping profiles of the semiconductor substrate are illustrated in FIGS. 3A to 3D and 4.

Figure 6C:
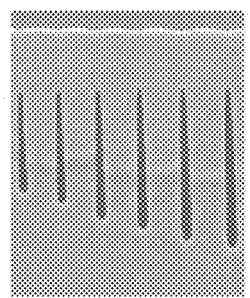
FIG. 6C illustrates a scanning electron micrograph of a part of a semiconductor substrate as illustrated in FIGS. 6A and 6B.

FIG. 6C illustrates a scanning electron micrograph of a part of a silicon substrate as illustrated in FIGS. 6A and 6B.

Figure 7:
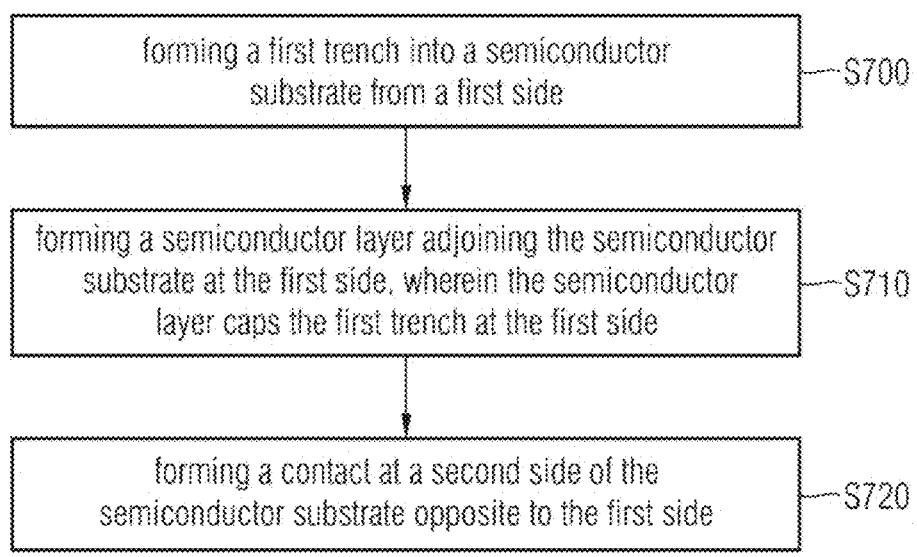
FIG. 7 is a simplified flow chart of a method of manufacturing a semiconductor device according to an embodiment.

FIG. 7 is a simplified flowchart of a method of manufacturing a semiconductor device according to an embodiment.

Process feature S700 includes forming a first trench into a semiconductor substrate from a first side.

Process feature S710 includes forming a semiconductor layer adjoining the semiconductor substrate at the first side, wherein the semiconductor layer caps the first trench at the first side.

Process feature S720 includes forming a contact at a second side of the semiconductor substrate opposite to the first side.

According to an embodiment, forming the semiconductor layer on the semiconductor substrate includes surface diffusion mediated reflow of material of the semiconductor substrate at the first side by a heat treatment of the semiconductor substrate in a temperature range between 900° C. and 1400° C., and in an ambient environment including hydrogen, and depositing a first semiconductor layer by epitaxy. Afterwards, an epitaxial silicon layer can be deposited on this semiconductor layer.

According to yet another embodiment, the method further includes forming a dielectric at a bottom of the first trench. The dielectric may cause a process of removing the semiconductor substrate from the second side to stop when the process of removing the semiconductor substrate reaches the dielectric at the bottom of the first trench.

According to yet another embodiment, the method further includes filling the first trench at least partly with a conductive material before forming the semiconductor layer. With regard to the conductive material and optional diffusion barrier(s), reference is drawn to the embodiments illustrated in FIGS. 3A to 3D and the related part of the description above.

According to yet another embodiment, the method further includes forming a diffusion source in the first trench and introducing dopants from the diffusion source into the semiconductor substrate by a thermal treatment. A diffusion profile as illustrated in FIG. 4 may result.

Figure 8A:
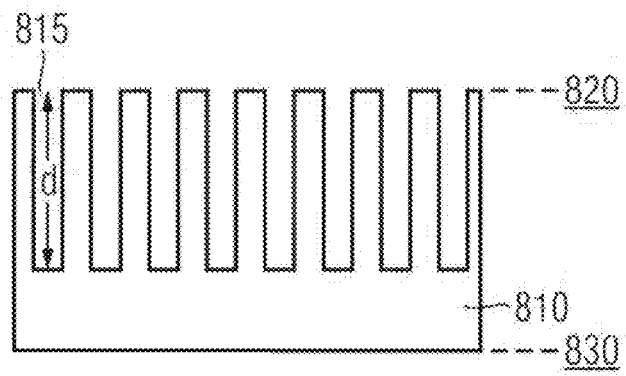
FIG. 8A is a schematic cross-sectional view of a semiconductor substrate after forming trenches at a first side in accordance with an embodiment.

FIG. 8A is a schematic cross-sectional view of a semiconductor substrate 810 after forming first trenches 815 from a first side 820. As an example, the semiconductor substrate may be a 12-inch (300 mm) semiconductor wafer, or may include a wafer diameter smaller than 12 inches, e.g. 8 inches (200 mm) or 6 inches (150 mm), or may include a wafer diameter of more than 300 mm. The first trenches 815 may be formed into the semiconductor substrate 810 by an appropriate etch process, for example anisotropic etching such as dry etching.

According to an embodiment, the first trenches 815 may be etched to a depth d ranging between 20 µm and 200 µm. An aspect ratio of the trenches may range between 10 and 50. The portions to be etched in the semiconductor substrate 810 may be defined by an etch mask, e.g., a patterned hard mask or a patterned photoresist on the semiconductor substrate 810.

An optional diffusion source, e.g., a doped glass or a highly doped semiconductor layer, may be arranged at sidewalls of the trenches 815 after a cleaning process. Thermal heating may be carried out to diffuse dopants from the dopant source into the semiconductor substrate 810 surrounding the first trenches 815. When increasing a thermal budget, e.g., by increasing a duration of thermal heating and/or by increasing a maximum temperature during thermal heating, a number of dopants and an extension of these dopants into the semiconductor substrate 810 can be increased. The dopants introduced into the semiconductor substrate 810 may lead to a change of the original conductivity type. As an example, when starting with a p-doped silicon wafer and introducing n-type dopants such as P into the silicon wafer via sidewalls of the first trenches 815 by diffusion out of a diffusion source, the conductivity type of the silicon wafer may be set from p-type to n-type (or vice versa). When increasing the thermal budget and decreasing a spacing between neighboring first trenches 815, a variation of doping concentration along a lateral direction can be reduced due to overlap of diffusion profiles resulting from opposite first trenches 815. The diffusion source may be removed from the trench after the diffusion process, e.g., by an etch process.

Figure 8B:
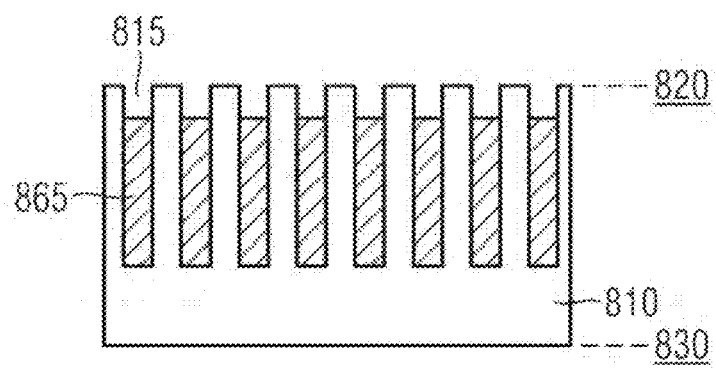
FIG. 8B is a schematic cross-sectional view of the semiconductor substrate of FIG. 8A after filling the trench at least partly with a conductive material.

Referring to the schematic cross-sectional view of the semiconductor substrate 810 illustrated in FIG. 8B, the trenches 815 are partly filled with a conductive material 865. As an example, the conductive material 865 includes or consists of carbon (C). This allows to provide a self-aligned stop at a bottom side of the carbon when removing the semiconductor substrate 810 from a second side 830 opposite to the first side 820.

The first trenches 815 may be partly or fully filled with the conductive material 865 and the conductive material 865 may include voids. Apart from carbon constituting the conductive material 865, other conductive materials may be used. Conductive materials having a thermal expansion coefficient similar to a material of the semiconductor substrate 810 may be beneficial with regard to counteracting stress induced by a thermal budget acting on the semiconductor substrate 810 during further processing. According to other embodiments, metals and/or metal alloys or layer stacks of different metals and/or metal alloys may be used to adjust a desired thermal expansion coefficient of the conductive material 865 in the first trenches 815.

If a diffusion constant of the conductive material 865 filled into the first trenches 815 is too high with regard to a material of the semiconductor substrate 810, a surface of the first trenches 815 and/or a top side of the conductive material 865 may be covered with a diffusion barrier, e.g., one or a plurality of TiN, TaN, $Si_3N_4$, $SiO_2$. Also, a combination of these materials may be used. The diffusion barrier may encapsulate the conductive material 865 formed in the first trenches 815. In other words, the diffusion barrier may line sidewalls and a bottom side of the trench as well as a top side of the conductive material 865 filled in the first trenches 815. Thus, contamination of process equipment or other wafers by out-diffusion can be avoided or reduced. This further allows for a larger number of conductive materials that may be used.

Figure 8C:
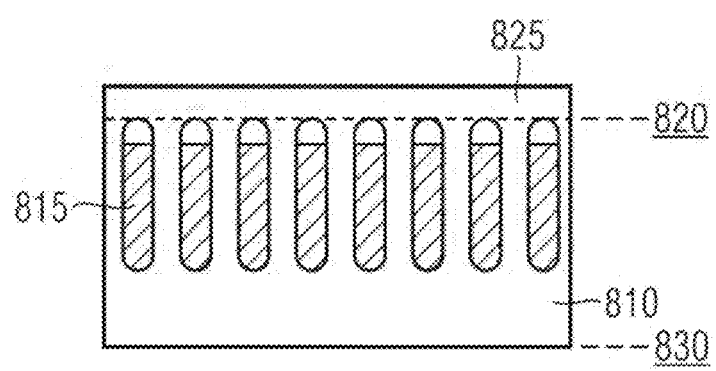
FIG. 8C is a schematic cross-sectional view of the semiconductor substrate of FIG. 8B after forming a semiconductor layer adjoining the semiconductor substrate at the first side.

Referring to the schematic cross-sectional view of the semiconductor substrate 810 illustrated in FIG. 8C, a semiconductor layer 825 is formed on the semiconductor substrate 810 and adjoins the semiconductor substrate 810 at the first side 820. The semiconductor layer 825 caps the first trenches 815 at the first side 820. In case the trench is not completely filled with conductive material, formation of the semiconductor layer 825 includes, for example surface diffusion mediated reflow of material of the semiconductor substrate 810 by a heat treatment of the semiconductor substrate 810. In case of a silicon substrate, a temperature may range between 900° C. and 1400° C. in an ambient including hydrogen. Alternatively, a remaining trench volume of an incomplete filling with conductive material may be filled with silicon by lateral epitaxy or lateral epitaxial overgrowth.

By surface diffusion mediated reflow of material, edges of a top side of the first trenches 815 can be rounded and the top sides of the first trenches 815 can be closed. Subsequently, a semiconductor layer 825 may be deposited by epitaxy on the semiconductor substrate 810 at the first side 820. If the trench is completely filled with conductive material, epitaxial lateral overgrowth of the silicon layer will result in a homogeneous silicon layer 825. A material of the semiconductor layer 825 deposited on the semiconductor substrate 810 may correspond to the material of the semiconductor substrate 810. According to another embodiment, these materials may differ, leading to a stress induced in the semiconductor layer 825 deposited on the semiconductor substrate 810. By appropriate choice of materials, the stress induced in the semiconductor layer 825 deposited on the semiconductor substrate 810 may be kept in a range that is acceptable for further processing of a semiconductor device.

According to an embodiment, a part of the semiconductor substrate 810 at the first side 820 may be removed, after closing the first trenches 815 by surface diffusion mediated reflow of the material of the semiconductor substrate 810, and before depositing a semiconductor layer thereon. As an example, chemical mechanical polishing (CMP) may be used.

The semiconductor layer 825 deposited on the semiconductor substrate 810 may be formed by epitaxy, using process gases such as trichlorosilane (TCS) or dichlorosilane (DCS) when forming the semiconductor layer 825 as a silicon layer.

When closing the first trenches 815 by surface diffusion mediated reflow of material of the semiconductor substrate 810, a width of the first trench may range between 0.2 µm to 5 µm, for example.

Since mesa regions between opposing first trenches 815 lack a formed closure, a top side of a wafer may deflect with regard to the semiconductor substrate 810, leading to a beneficial reduction of wafer bow.

Known processes for forming a discrete semiconductor or circuit elements of an integrated circuit in the semiconductor layer 825, e.g., ion implantation processes for forming p- and n-doped semiconductor zones in the semiconductor layer 825 may follow. Examples of device(s) that may be formed in the semiconductor layer 825 are illustrated in FIGS. 2A and 2B.

Figure 8D:
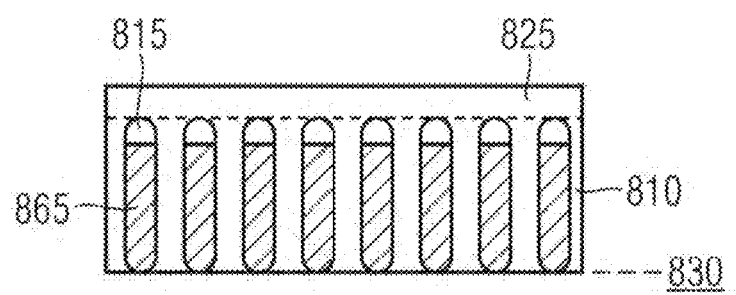
FIG. 8D is a schematic cross-sectional view of the semiconductor substrate of FIG. 8C after removing a part of the semiconductor substrate from a second side opposite to the first side.

Referring to the schematic cross-sectional view of the semiconductor substrate 810 illustrated in FIG. 8D, a part of the semiconductor substrate 810 is removed from the second side 830. According to an embodiment, the semiconductor substrate 810 is removed from the second side up to a bottom side of the first trench 815. According to another embodiment, removal of the semiconductor substrate 810 ends before reaching a bottom side of the first trenches 815. In other words, a part of the semiconductor substrate 810 may remain below a bottom side of the first trenches 815.

When removing the semiconductor substrate 810 from the second side 830 up to a bottom side of the first trenches 815, reaching a material at a bottom side of the first trench 815, e.g., C or $SiO_2$, may lead to a change in a characteristic during removal of the semiconductor substrate 810 that may be used to terminate to process of removing the semiconductor substrate 810.

Figure 8E:
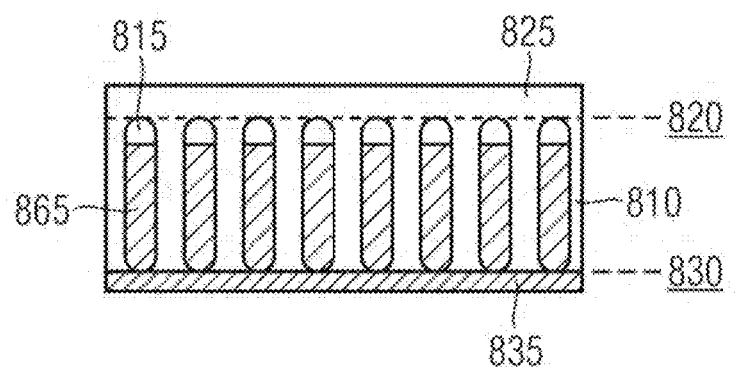
FIG. 8E is a schematic cross-sectional view of the semiconductor substrate of FIG. 8D after forming a contact at the second side.

Referring to the schematic cross-sectional view of the semiconductor substrate 810 illustrated in FIG. 8E, a contact 835 including a layer or a layer stack of a conductive material such as a metal or metal alloy is formed at the second side 830. Prior to deposition of a backside metallization, an ion implantation through the second side 830 can be carried out, e.g., using a high-dose phosphorous or boron implantation to form a low-ohmic n- or p-backside contact.

Further known processes may follow to manufacture a desired semiconductor device. As regards the conductive material 865 and optional diffusion barrier(s) filled in the first trenches 815, reference is drawn to the embodiments illustrated in FIGS. 3A to 3D.

According to another embodiment, the first trenches 815 may be filled with conductive material(s) after closing the first trenches 815 at the first side 820. In other words, the first trenches 815 may be filled with conductive material(s) after removing the semiconductor substrate 810 from the second side 830 to a bottom side of the first trenches 815.

The above-described device(s) and method(s) allow for a reduced on-state resistance of vertical semiconductor devices by improving a conductivity of a semiconductor substrate with one or a combination of the measures described above.

The above measures improve heat dissipation and heat capacity of semiconductor devices. This may allow other measures such as front side cooling and/or flip-chip mounting to be dispensed with.

Alignment of the first trenches 815 may be adapted to an alignment of device elements in the semiconductor layer 825. As an example, stripe-shaped first trenches 815 may be aligned in parallel to stripe-shaped transistor cells in the semiconductor layer 825. Thereby, wafer bow or substrate bow may be reduced.

As a further example, first trenches 815 including voids may be arranged in an edge area of a semiconductor device, e.g., in an edge area of a transistor cell array. The trenches 815 may be partly or fully filled with a dielectric, e.g., $SiO_2$. This allows the reduction or avoidance of charge carrier injection in the edge area when operating a body diode (similar to the principle of high dynamic ruggedness (HDR) of IGBT and diode).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor substrate;
   a first trench extending into or through the semiconductor substrate from a first side, the first trench being at least partially filled with a conductive material and electrically connected to the semiconductor substrate via a doped semiconductor layer at a sidewall of the first trench;
   a semiconductor layer adjoining the semiconductor substrate at the first side, the semiconductor layer capping the first trench at the first side;
   a contact at a second side of the semiconductor substrate opposite to the first side; and
   a second trench extending into the semiconductor layer, wherein a bottom side of the second trench ends within the semiconductor layer and above the semiconductor substrate.

2. The semiconductor device of claim 1, wherein the semiconductor substrate includes p-type dopants and n-type dopants, and wherein a concentration of the p-type dopants is lower than a concentration of the n-type dopants.

3. The semiconductor device of claim 2, wherein the semiconductor substrate is a silicon substrate having a concentration of boron between $5\times10^{14}$ $cm^{-3}$ and $5\times10^{15}$ $cm^{-3}$.

4. The semiconductor device of claim 2, wherein the semiconductor substrate includes n-type dopants, and wherein a profile of concentration of the n-type dopants decreases from a sidewall of the first trench into the semiconductor substrate along a lateral direction parallel to the first side.

5. The semiconductor device of claim 1, wherein a thermal expansion coefficient of the conductive material and the semiconductor substrate differ by less than 500%.

6. The semiconductor device of claim 1, wherein the conductive material comprises at least one of C, Mo, Cu, Al, Ti, Ta, and W.

7. The semiconductor device of claim 1, further comprising a void in the first trench.

8. The semiconductor device of claim 1, wherein the conductive material is at least partially porous.

9. The semiconductor device of claim 1, further comprising a diffusion barrier between the conductive material and the semiconductor substrate.

10. The semiconductor device of claim 1, wherein the diffusion barrier comprises at least one of TiN, TaN, and TiW.

11. A semiconductor device, comprising:
    a semiconductor substrate;
    a first trench extending into or through the semiconductor substrate from a first side, the first trench being partially filled with a conductive material having a vertical distance to a top side of the first trench;

a semiconductor layer adjoining the semiconductor substrate at the first side, the semiconductor layer capping the first trench at the first side;

a contact at a second side of the semiconductor substrate opposite to the first side; and wherein the conductive material is electrically connected to the semiconductor substrate via a doped semiconductor layer sidewall of the first trench, and a dopant concentration of the doped semiconductor layer decreases from a sidewall of the first trench into the semiconductor substrate along a lateral direction parallel to the first side.

12. A semiconductor device, comprising:

a semiconductor substrate;

a first trench extending into or through the semiconductor substrate from a first side, the first trench being at least partially filled with a conductive material and electrically connected to the semiconductor substrate via a doped semiconductor layer at a sidewall of the first trench;

a semiconductor layer adjoining the semiconductor substrate at the first side, the semiconductor layer capping the first trench at the first side;

a contact at a second side of the semiconductor substrate opposite to the first side; and wherein the semiconductor substrate includes p-type dopants and n-type dopants, a concentration of the p-type dopants is lower than a concentration of the n-type dopants, and wherein a profile of concentration of the n-type dopants decreases from a sidewall of the first trench into the semiconductor substrate along a lateral direction parallel to the first side.

* * * * *

UNITED STATES PATENT AND TRADEMARK OFFICE
CERTIFICATE OF CORRECTION

PATENT NO.         : 9,570,566 B2
APPLICATION NO.    : 14/879877
DATED              : February 14, 2017
INVENTOR(S)        : A. Mauder et al.

It is certified that error appears in the above-identified patent and that said Letters Patent is hereby corrected as shown below:

In the Claims

Column 13, Line 8 (Claim 11, Line 14) please change "layer sidewall" to -- layer at a sidewall --

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*